United States Patent
Brouillette et al.

Patent Number: 6,153,536
Date of Patent: Nov. 28, 2000

[54] METHOD FOR MOUNTING WAFER FRAME AT BACK SIDE GRINDING (BSG) TOOL

[75] Inventors: Donald W. Brouillette, Georgia; Ronald L. Mendelson, Richmond, both of Vt.

[73] Assignee: International Business Machines Corporation, Armonk, N.Y.

[21] Appl. No.: 09/262,601

[22] Filed: Mar. 4, 1999

[51] Int. Cl.[7] .......................... H01L 21/31; H01L 21/469
[52] U.S. Cl. ............................................. 438/758; 438/759
[58] Field of Search .............................. 257/700; 438/612, 438/109, 691, 758, 759; 451/41

[56] References Cited

U.S. PATENT DOCUMENTS

| | | | |
|---|---|---|---|
| 5,087,585 | 2/1992 | Hayashi | ..................................... 437/51 |
| 5,268,065 | 12/1993 | Grupen-shemansky | ................ 156/630 |
| 5,389,182 | 2/1995 | Mignardi . | |
| 5,411,921 | 5/1995 | Negoro . | |
| 5,457,072 | 10/1995 | Tamaki et al. . | |
| 5,632,667 | 5/1997 | Earl et al. | ................................. 451/41 |
| 5,637,395 | 6/1997 | Uemura et al. . | |
| 5,731,243 | 3/1998 | Peng et al. | .............................. 438/612 |
| 5,773,362 | 6/1998 | Tonti et al. . | |
| 5,986,338 | 11/1999 | Nakajima | ................................ 257/700 |

FOREIGN PATENT DOCUMENTS

| | | | |
|---|---|---|---|
| 9193863 | 7/1997 | Japan | ....................................... 21/304 |
| 63176265 | 7/1998 | Japan | ......................................... 21/30 |
| 11145089 | 5/1999 | Japan | ....................................... 21/304 |

*Primary Examiner*—John F. Niebling
*Assistant Examiner*—Walter L. Lindsay, Jr.
*Attorney, Agent, or Firm*—McGinn & Gibb, P. C.; Howard J. Walter, Esp

[57] ABSTRACT

A method for manufacturing a low profile semiconductor chip, includes fabricating a semiconductor device on a semiconductor wafer, grinding, with a grinding tool, a backside of the semiconductor wafer to reduce a thickness thereof, and with the wafer in the grinding tool, providing a support structure on the ground backside of the wafer.

20 Claims, 2 Drawing Sheets

METHOD FOR MOUNTING WAFER FRAME AT BACK SIDE GRINDING (BSG) TOOL

BACKGROUND OF THE INVENTION

1. Field of the Invention

The present invention generally relates to a tool and method for producing semiconductor chips, and more particularly to a wafer frame mounting method for a backside grinding (BSG) tool.

2. Description of the Related Art

Conventional systems utilize semiconductor wafers that are usually thinned by a backside grinding (BSG) process prior to being diced into individual chips for packaging into modules. The final wafer thickness depends on the package design and final module thickness required for a given application. Generally, the conventional grinding processes can produce an 8-inch diameter wafer to a thickness of about 300 $\mu$m without major difficulty.

However, thicknesses on the order of about 250 $\mu$m or less are difficult (if not impossible) to achieve by the conventional grinding process because the wafer is too fragile to be handled after the grinding operation. Thus, additional costly processing steps, such as etching and/or polishing, are required to strengthen the wafer, or the wafer is likely to be broken or damaged during subsequent handling. This problem will be even more acute as the wafer processing industry migrates to 12-inch wafers.

Additionally, wafers are often warped coming off of the grinder, thereby making difficult the handling and placement of the wafers into cassettes. It is envisioned that future higher density products will have even higher levels of warpage after the grinding operation.

SUMMARY OF THE INVENTION

In view of the foregoing and other problems of the conventional systems and methods, it is an object of the present invention to provide a method for mounting the backside ground wafer to a substrate prior to removing the wafer assembly (e.g., wafer and substrate) from the backside grinding chuck.

In a first aspect, a method of manufacturing a low profile semiconductor chip, according to the present invention, includes fabricating a semiconductor device on a semiconductor wafer; grinding, with a grinding tool, the backside of the semiconductor wafer to reduce a thickness thereof; and while the wafer is in the grinding tool, providing a support structure on the ground backside of the wafer.

In a second aspect of the invention, an apparatus for manufacturing such a chip is provided.

With the unique and unobvious structure and method of the invention, the substrate will support the wafer until it is segregated into dies and diced. The substrate can be a rigid or pliable material which can be used as a substrate for dicing. Such a method avoids additional costly processing such as etching and achieves thickness of 250 $\mu$m or less with minimal breakage and damage to the wafer.

BRIEF DESCRIPTION OF THE DRAWINGS

The foregoing and other objects, aspects and advantages will be better uderstood from the following detailed description of a preferred embodiment of the invention with reference to the drawings, in which:

FIG. 3C illustrates the process after the tape frame mount has been performed.

DETAILED DESCRIPTION OF PREFERRED EMBODIMENTS OF THE INVENTION

Figure 1:
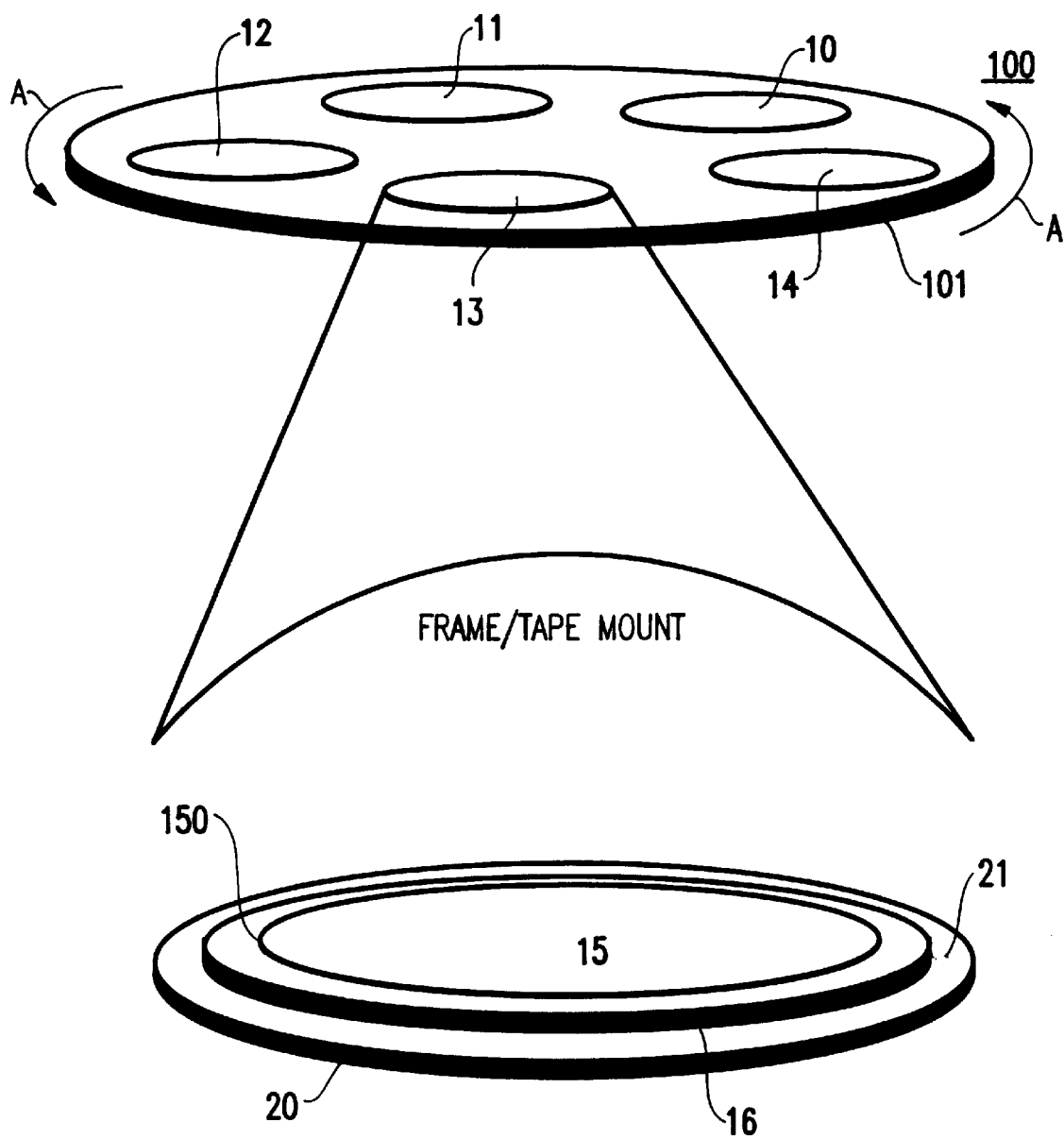
FIG. 1 is a schematic diagram of a backside grinding process and a tool therefor.

Referring now to the drawings, and more particularly to FIGS. 1–3C, a method and tool are shown according to a first embodiment of the present invention.

Generally, in the invention, in a dicing process for the wafer, devices are tested on the wafer, and the wafer is backside thinned. Then, a support structure is provided on the ground surface while the wafer is held at its front surface by a vacuum chuck that holds the wafer during the grinding operation. Then the wafer is removed from the chuck, a subsequent front-side protective film is removed, the wafer is diced, and the support structure is either removed or left in place. As a result, a suitable thickness of the wafer may be achieved, without costly, additional processing, and without breakage to the wafer.

In FIG. 1, an apparatus 100 is provided for processing a wafer 150 through various stages of loading 10, rough grinding 11, finish grinding 12, a stage 13 of mounting the wafer to a substrate (e.g., rigid carrier 160 shown in FIG. 3A), and subsequent unloading 14 for further processing. The apparatus is, for example, a carousel rotatable through such stages as shown in the direction of arrows A.

The apparatus 100 may include a plurality of chuck members each dedicated for use for a particular wafer. Thus, each chuck carries a wafer through all of the processing stages. It is noted that additional stages may also be provided as is known. For example, there could be a third grinding stage and a washing/drying stage before the wafer mounting to the substrate stage.

In FIG. 1, a taped frame (or substrate assembly) 20 is applied to the wafer 150. It is noted that the wafer 150 has a frontside (not illustrated) with a plurality of semiconductor devices being provided thereon, and a backside 15. The frame is preferably a taped frame having an adhesive (e.g., dicing tape 21) thereon. The dicing tape provides a guide for subsequent dicing of the wafer 150.

The frame materials may be selectively chosen depending on the application of the chips being formed, etc. Typically, the frame is in the form of a ring and has a shape (e.g., diameter) slightly greater (e.g., preferably a 1-inch clearance between the edge of the wafer and the edge of the substrate assembly) than that of the wafer 150 for protecting the wafer and allowing easy handling thereof.

Once the wafer grinding is complete as shown at reference numeral 12, the wafer is typically washed and dried (not shown in FIG. 1). Then, the wafer 13 is mounted to the taped frame 20 before the wafer is removed from a grinding chuck 16. As shown, the wafer backside 15 is facing upwardly, with the front side thereof laying against on the grinding chuck (vacuum chuck) 16. After grinding, the wafer in such a position is ready to receive the frame/substrate assembly 20 having dicing tape/adhesive 21 thereon.

Briefly, the process of applying the wafer to the substrate includes prefabricating a taped frame assembly, aligning the taped frame to a wafer/chuck assembly, lowering the taped frame to contact the backside of the wafer, and then using a pressure-applying device (e.g., such as a roller and/or a "squeegee") which applies pressure across film to laminate the structure to the wafer.

Thereafter, the wafer can be removed from the grinding chuck 16 (e.g., the vacuum chuck) and processed through subsequent process steps while mounted to the frame assembly 20. The frame assembly 20 provides support for the wafer 13 until final dicing and chip placement.

If additional support is necessary, a rigid plastic or metal substrate with an adhesive layer (e.g., or any structure/ material stronger than the thinned wafer; in the case of tape, it is not stronger than the wafer but it isolates the wafer from handling—frame is used) can be used to support the wafer before removal from the grinding chuck 16 through subsequent processing until dicing.

The materials should be light permeable if ultraviolet (UV)-light-curable adhesives are used. As noted above, the material and thickness of the frame/substrate assembly may be freely selected based on the application involved.

Alternatively to mounting the backside grinding wafer to a non-rigid or rigid substrate prior to removal from the grinding chuck 16, the wafer could be mounted frontside to a rigid substrate prior to the grinding operation. This operation would be especially useful if there was a great deal of time or distance involved in transporting the wafer assembly to the dicing stage. Preferred materials for the rigid substrate may include adhesively mounted plastic and/or metal substrates, and preferred thicknesses are substantially within a range of about 0.5 to about 5.0 mm. The rigid substrate may serve as a stabilizer for handling until the wafer is mounted to a dicing frame. Adhesive tack may be provided and is designed or adjusted by ultra violet curing to allow the rigid substrate to be removed prior to dicing.

Figure 2:
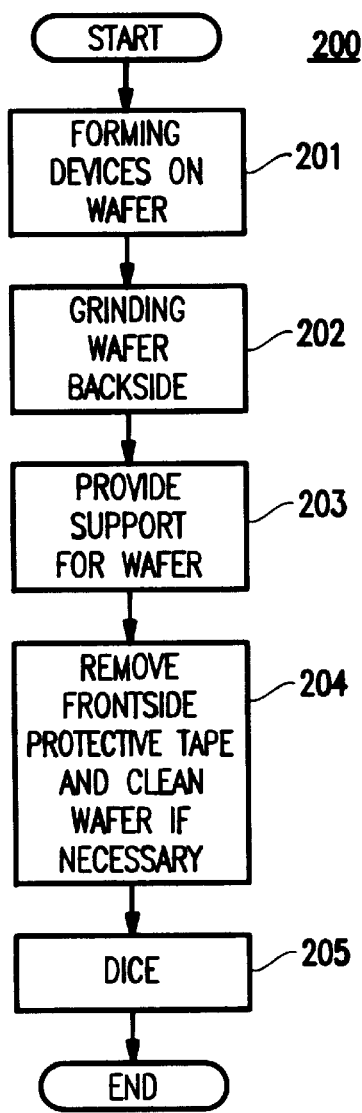
FIG. 2 is a flow diagram illustrating a preferred method of the invention.

Turning to FIG. 2, a flowchart of the inventive method 200 for processing the wafer is shown. In step 201, a plurality of semiconductor devices (e.g., active semiconductor devices) are formed on a front side of a wafer.

In step 202, the wafer backside is ground by a grinding tool.

In step 203, in the grinding tool used for grinding the backside of the wafer, a support structure is provided on the ground backside of the wafer. It is noted that backside cleaning and/or polishing optionally could be performed between steps 202 and 203.

An etching or polishing step can be added to the grind tool after the in-process mounting operation and removal of a frontside protective tape, as shown in step 204. More specifically, a protective tape 170 (170') is typically used to protect the front side of the wafer during grinding (e.g. of the backside) from damage incurred by virtue of the frontside's contact with, and being held by, the vacuum chuck 16. It is noted that due to its non-rigid or semi-rigid characteristic, the protective (adhesive) tape 170 (170') is for preventing damage, not necessarily for providing support to the thinned wafer. When the protective tape is removed, some adhesive residue may remain on the frontside of the wafer. Thus, the cleaning step would be desirable. The cleaning step may include cleaning the wafer if necessary, by any of a number of known methods.

Thereafter, the wafer is ready for dicing and is diced in step 205.

Figure 3A:
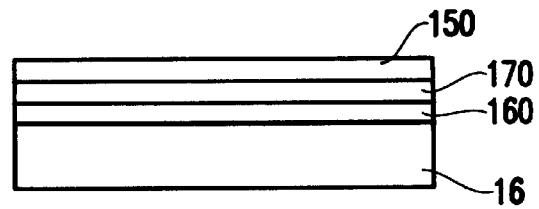
FIGS. 3A–3C illustrate a cross-section of the layer configurations after various processing steps, with FIG. 3A illustrating a layer configuration after a rigid carrier is mounted to a wafer prior to grinding, FIG. 3B illustrating a standard grind set-up.
Figure 3B:
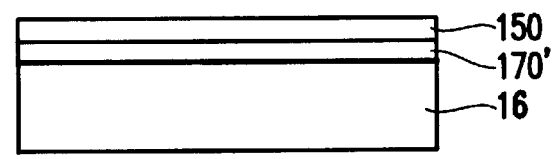
Figure 3C:
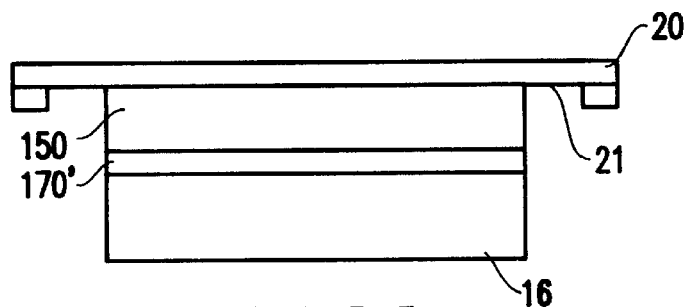

FIGS. 3A–3C illustrate a cross-section of the layer configurations for various embodiments of the invention.

For example, FIG. 3A illustrates an alternate embodiment in which a rigid carrier 160 (substrate) is mounted to the wafer prior to grinding. Such a rigid substrate 160 provides stability to the wafer prior to grinding. It is noted that the rigid carrier optionally could have the adhesive tape 170 (e.g., a double-sided adhesive tape) provided on a surface opposed to the wafer. Such a double-sided adhesive layer 170 would protect the front side of the wafer 150. However, the wafer could have the rigid carrier mounted directly thereon with no intervening adhesive layer.

FIG. 3B illustrates a standard grind set-up in which the wafer 150 has no support member and is held by the vacuum chuck during grinding. Further, a single-sided adhesive tape 170' could be employed on the frontside of the wafer 150 to protect the same during grinding.

Finally, FIG. 3C illustrates the wafer 150 being support after the tape frame 20 has been mounted to the wafer after grinding by means of adhesive or the like. The tape/frame mount 20 provides stability to the thinned wafer after grinding. As before, the optional frontside protective tape 170' is shown.

Thus, with the method of the invention, the substrate supports the wafer until it is segregated into dies. The substrate can be a rigid or pliable material which can be used as a substrate for dicing. Such a method avoids additional costly processing such as etching, and achieves a low profile wafer (i.e. with a thickness of approximately 275 $\mu$m or less) with minimal breakage and damage to the wafer.

Further, the method inexpensively allows wafer thinning to minimal dimensions and the invention allows minimal final package thicknesses.

While the invention has been described in terms of preferred embodiments, those skilled in the art will recognize that the invention can be practiced with modification within the spirit and scope of the appended claims.

What is claimed is:

1. A method of manufacturing a semiconductor chip, comprising:

fabricating a semiconductor device on a semiconductor wafer;

grinding, with a grinding tool, a backside of the semiconductor wafer to reduce a thickness thereof; and with said wafer in the grinding tool, providing a support structure on the ground backside of the wafer.

2. The method according to claim 1, wherein said wafer is mounted to a taped frame before the wafer is removed from the grinding tool, such that said wafer is removable from the grinding tool for processing through subsequent process steps while mounted to the support structure.

3. The method according to claim 1, further comprising providing an additional support to support the wafer before removing the wafer from the grinding tool for subsequent processing until dicing.

4. The method according to claim 3, wherein said additional support comprises a substrate formed of at least one of rigid plastic and metal.

5. The method according to claim 1, further comprising providing one of a rigid and pliable material on the backside of the wafer.

6. The method according to claim 5, wherein said rigid material comprises a rigid plastic substrate with an adhesive layer thereon.

7. The method according to claim 1, further comprising providing a structural support on a front side of said wafer.

8. The method according to claim 1, wherein said structural support on the front side of said wafer is mounted on said wafer prior to said wafer entering the grind tool.

9. The method according to claim 1, further comprising holding a frontside of said wafer with a vacuum chuck while said backside of the wafer is ground.

10. The method according to claim 9, further comprising providing a protective layer on said frontside of said wafer prior to said wafer being held by said vacuum chuck.

11. A method of manufacturing a wafer, comprising:

fabricating a device on a wafer;

grinding, with a grinding tool, a side of the wafer to reduce a thickness thereof; and with said wafer in the grinding tool, providing a support structure on the ground side of the wafer.

12. The method according to claim 11, wherein said wafer is mounted to a taped frame before the wafer is removed from the grinding tool, such that said wafer is removable from the grinding tool for processing through subsequent process steps while mounted to the support structure.

13. The method according to claim 11, further comprising providing an additional support to support the wafer before removing the wafer from the grinding tool for subsequent processing until dicing.

14. The method according to claim 13, wherein said additional support comprises a substrate formed of at least one of rigid plastic and metal.

15. The method according to claim 12, further comprising providing one of a rigid and pliable material on the backside of the wafer.

16. The method according to claim 15, wherein said rigid material comprises a rigid plastic substrate with an adhesive layer thereon.

17. The method according to claim 15, wherein said rigid material is above 0.5 mm to about 5 mm thick.

18. The method according to claim 12, wherein said structural support on the front side of said wafer is mounted on said wafer prior to said wafer entering the grind tool.

19. The method according to claim 12, further comprising holding a frontside of said wafer with a vacuum chuck while said backside of the wafer is ground.

20. The method according to claim 19, further comprising providing a protective layer on said frontside of said wafer prior to said wafer being held by said vacuum chuck.

* * * * *